United States Patent
Wu et al.

(10) Patent No.: US 6,998,226 B2
(45) Date of Patent: Feb. 14, 2006

(54) METHOD OF FORMING PATTERNED PHOTORESIST LAYER

(75) Inventors: Yuan-Hsun Wu, Jungli (TW); Wen-Bin Wu, Taoyuan (TW); Yung Long Hung, Shulin (TW); Ya Chih Wang, Yunghe (TW)

(73) Assignee: Nanya Technology Corporation, Taoyuan (TW)

( * ) Notice: Subject to any disclaimer, the term of this patent is extended or adjusted under 35 U.S.C. 154(b) by 141 days.

(21) Appl. No.: 10/193,464

(22) Filed: Jul. 10, 2002

(65) Prior Publication Data

US 2003/0180666 A1 Sep. 25, 2003

(30) Foreign Application Priority Data

Mar. 21, 2002 (TW) .............................. 91105492 A

(51) Int. Cl.
*G03F 7/38* (2006.01)
*G03F 7/40* (2006.01)

(52) U.S. Cl. .................... 430/330; 430/311; 430/950
(58) Field of Classification Search ............... 430/311, 430/313, 330, 329, 322, 950
See application file for complete search history.

(56) References Cited

U.S. PATENT DOCUMENTS

| | | | |
|---|---|---|---|
| 5,401,613 A | 3/1995 | Brewer et al. ............... | 430/323 |
| 6,316,165 B1 | 11/2001 | Pavelchek et al. .......... | 430/311 |
| 6,410,209 B1 | 6/2002 | Adams et al. ............... | 430/311 |
| 6,420,098 B1 | 7/2002 | Mautz ......................... | 430/313 |
| 6,479,200 B1 | 11/2002 | Stirton ......................... | 430/30 |
| 6,529,282 B1 | 3/2003 | Stirton et al. ............... | 356/630 |
| 6,610,616 B1 | 8/2003 | Koh et al. ................... | 438/781 |
| 6,627,391 B1 | 9/2003 | Ito et al. ..................... | 430/322 |
| 2003/0065164 A1 | 4/2003 | Puligadda et al. ........... | 536/58 |
| 2003/0129527 A1 * | 7/2003 | Kudo et al. ............... | 430/270.1 |

* cited by examiner

*Primary Examiner*—Kathleen Duda
(74) *Attorney, Agent, or Firm*—Ladas & Parry LLP

(57) ABSTRACT

A method of forming a patterned photoresist layer. First, an anti-reflection coating layer is formed on a substrate. Next, a first bake is performed. A photoresist layer is then formed on the anti-reflection coating layer. Exposure is performed. A second bake is performed, wherein the temperature difference between the first bake and the second bake is about 35 ° C.~55 ° C. Finally, development is performed. The patterned photoresist layer features have perfect profiles in accordance with this invention.

15 Claims, 5 Drawing Sheets

METHOD OF FORMING PATTERNED PHOTORESIST LAYER

BACKGROUND OF THE INVENTION

1. Field of the Invention

The present invention relates in general to semiconductor manufacturing, and particularly to formation of a patterned photoresist layer by photolithography.

2. Description of the Related Art

As semiconductor manufacturers have sought to fabricate devices with a higher degree of circuit integration to improve device performance, it has become necessary to use photolithographys with shorter wavelengths in the mid and deep UV spectra to achieve fine features. In the process of making the desired very fine patterns, many optical effects are experienced which lead to distortion or displacement of images in the photoresist that are directly responsible for wiring line width variations, opens and shorts, all of which can lead to deteriorated device performance. Many of these optical effects are attributable to substrate geometry and reflectivity influences that include halation and other reflected light scattering effects which may occur due to uneven topography or the varying (wavelength dependent) reflectivity of the substrates and wires or layers being patterned thereon to define the desired features. Such effects are further exacerbated by both the non-uniformity of the photoresist film and film thickness. These effects are manifested in lithographic patterns uneven line width, often with "reflective notching", due to standing wave phenomena, and non-vertical pattern side walls.

One way to solve standing wave phenomena is the application of anti-reflection coating (ARC). An anti-reflection coating is formed on a substrate to impede reflection of the light source.

Post-exposure baking (PEB) of the photoresist layer before development process is another way to solve standing wave phenomena. The structure of the photoresist layer is rearranged, thereby, standing wave phenomena are alleviated.

In traditional photolithography, a bake is usually performed twice to improve the profiles of the patterned photoresist layer. However, the baking temperature adversely affects the profiles thereof. If the structure of the photoresist layer is not dense enough, an undercut problem will occur when the baking temperature is too low. If the structure of the photoresist layer is too dense, a footing problem will occur when the baking temperature is too high.

Prior-art photolithography is shown in FIG. 1A to FIG. 1D.

In FIG. 1A, a substrate 101 is provided. An anti-reflection coating layer 102 is preferably formed on the substrate 101 by spin coating. A bake is then performed to strengthen the structure of the anti-reflection coating layer 102.

In FIG. 1B, a photoresist layer 103 is preferably formed on the anti-reflection coating layer 102 by spin coating. Exposure is then performed using a selected mask to transfer the mask patterns to the photoresist layer 103. Next, a post-exposure bake is performed.

In FIG. 1C, development is performed to form a patterned photoresist layer.

However, an undercut 104a and a footing 104b occur in the patterned photoresist layer in accordance with traditional photolithography, as shown in FIG. 1C.

SUMMARY OF THE INVENTION

The object of the present invention is to provide a method of forming a patterned photoresist layer having perfect profiles to avoid undercut and footing problem and to enhance the resolution of the patterned photoresist layer.

The method comprises the following steps. First, a substrate is provided. Next, an anti-reflection coating layer is formed on the substrate. A first bake is then performed. A photoresist layer is formed on the anti-reflection coating layer. Exposure is performed. A second bake is performed, wherein the temperature difference between the first bake and the second bake is about 35° C.~55° C. Finally, development is performed.

BRIEF DESCRIPTION OF THE DRAWINGS

The above and other objects, features, and advantages of the present invention will become apparent from the following detailed description of preferred embodiments of the invention explained with reference to the accompanying drawings, in which.

DETAILED DESCRIPTION OF THE INVENTION

There will now be described an embodiment of this invention with reference to the accompanying drawings.

In step S10, a substrate 110 is provided.

Figure 1A:
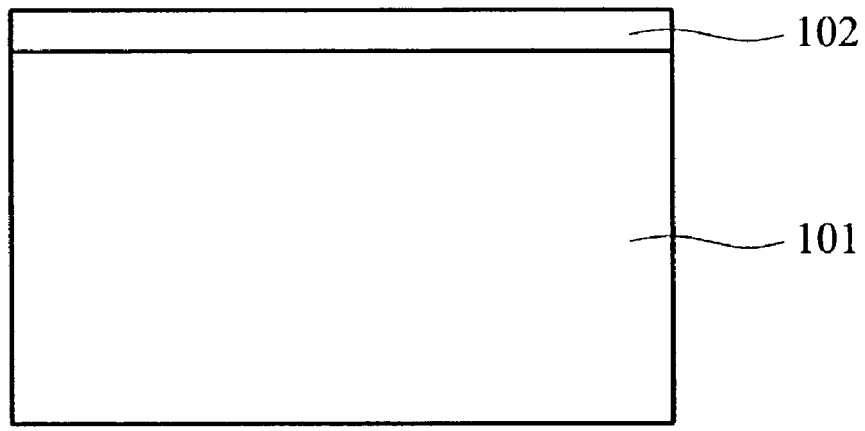
FIGS. 1A–1D are schematic cross-sections illustrating steps for forming a patterned photoresist layer according to the prior art.
Figure 1B:
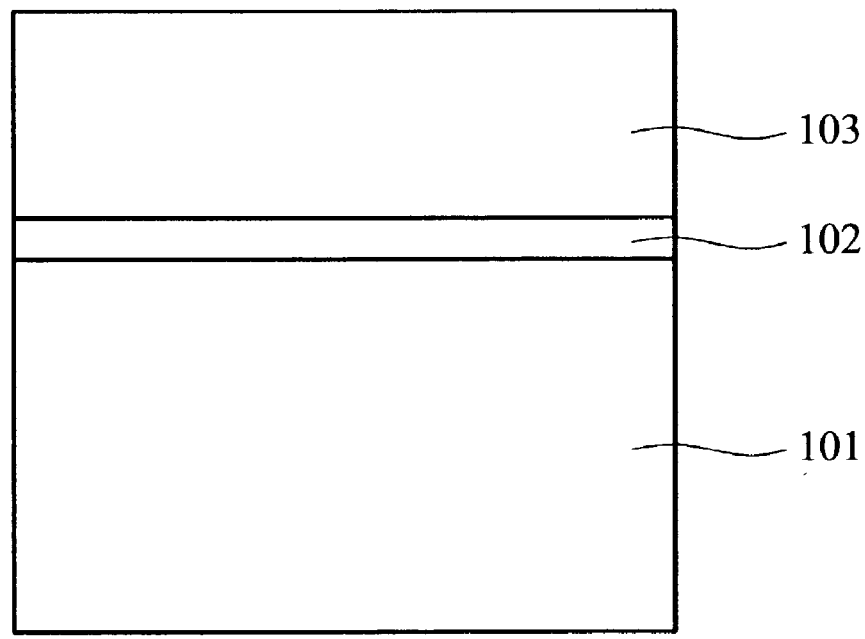
Figure 1C:
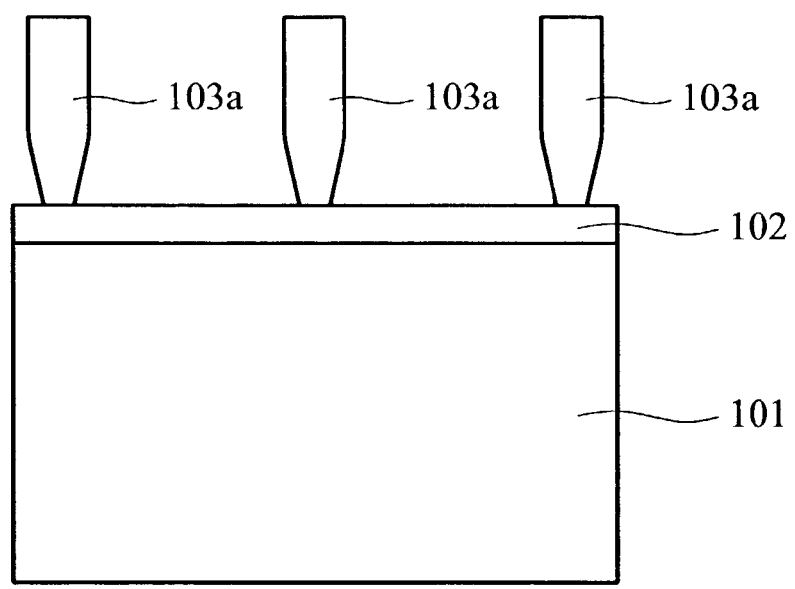
Figure 1D:
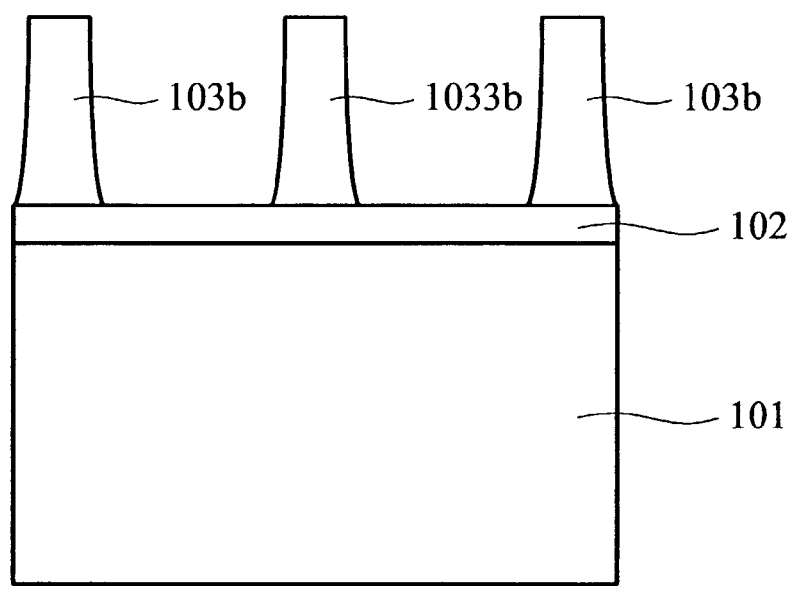
Figure 2A:
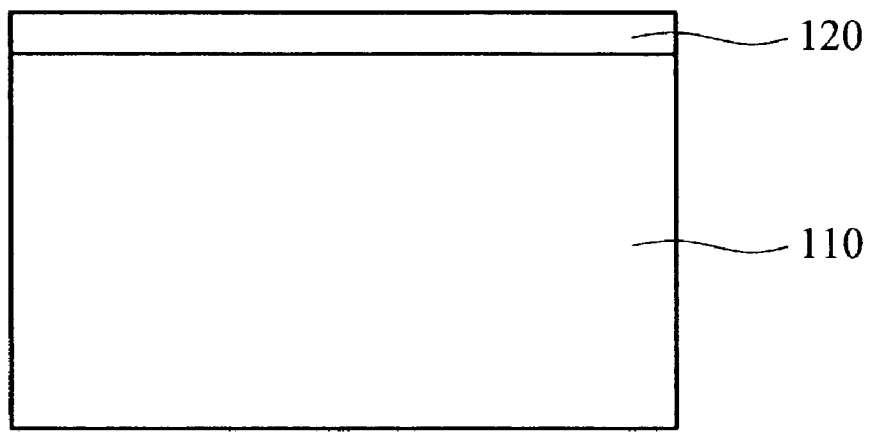
FIGS. 2A–2C are schematic cross-sections illustrating steps for forming a patterned photoresist layer according to the preferred embodiment of the invention.

In step S20, an anti-reflection coating layer 120 is preferably formed on the substrate 110 by spin coating, as shown in FIG. 2A. The anti-reflection coating layer 120 is selected from the group of organic anti-reflection coating, inorganic anti-reflection coating, or dielectric anti-reflection coating.

In step S30, a first bake is then performed to strengthen the structure of the anti-reflection coating layer 120 at a first baking temperature (T1) between 165° C. and 205.

Figure 2B:
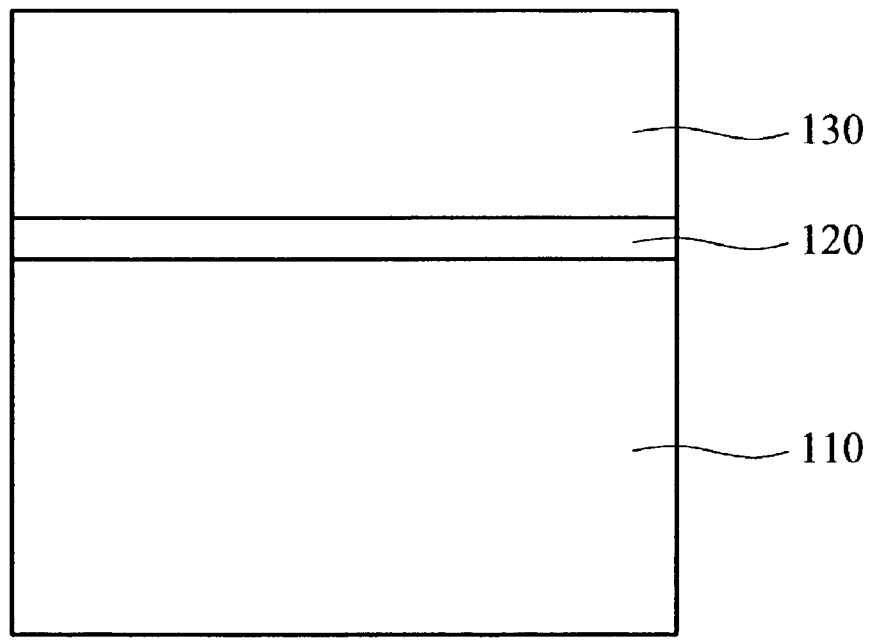

In step S40, a photoresist layer 130 is preferably formed on the anti-reflection coating layer 120 by spin coating, as shown in FIG. 2B.

In step S50, Exposure, such as contact exposure, proximity exposure, or projection exposure, is then performed using a selected mask (not shown) to transfer the mask patterns to the photoresist layer 130. In step S60, a second bake, the post-exposure bake (PEB), is performed to rearrange the photoresist structure by an ultraviolet (UV) ray at the second baking temperature between 120° C. and 140° C. The difference (T1–T2) between the first baking temperature (T1) and the second baking temperature (T2) is controlled at 35° C.~55° C. and exact at 45° C. Thereby, standing wave phenomena is avoided.

Figure 2C:
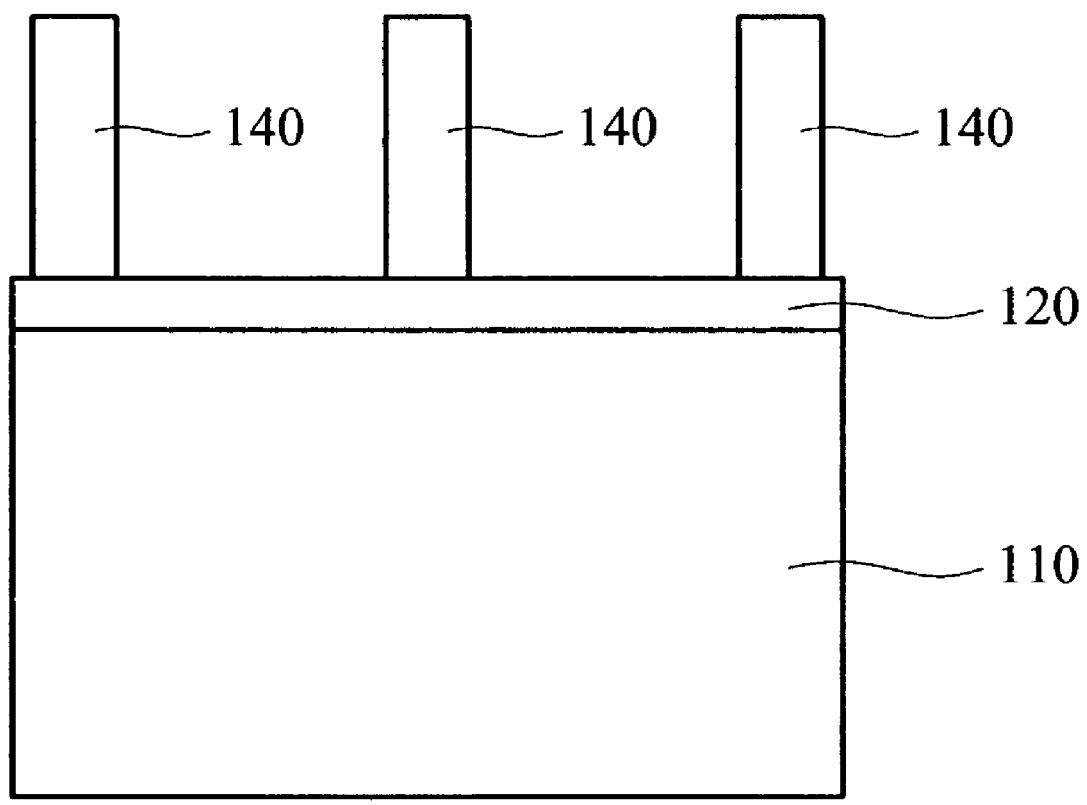
Figure 3:
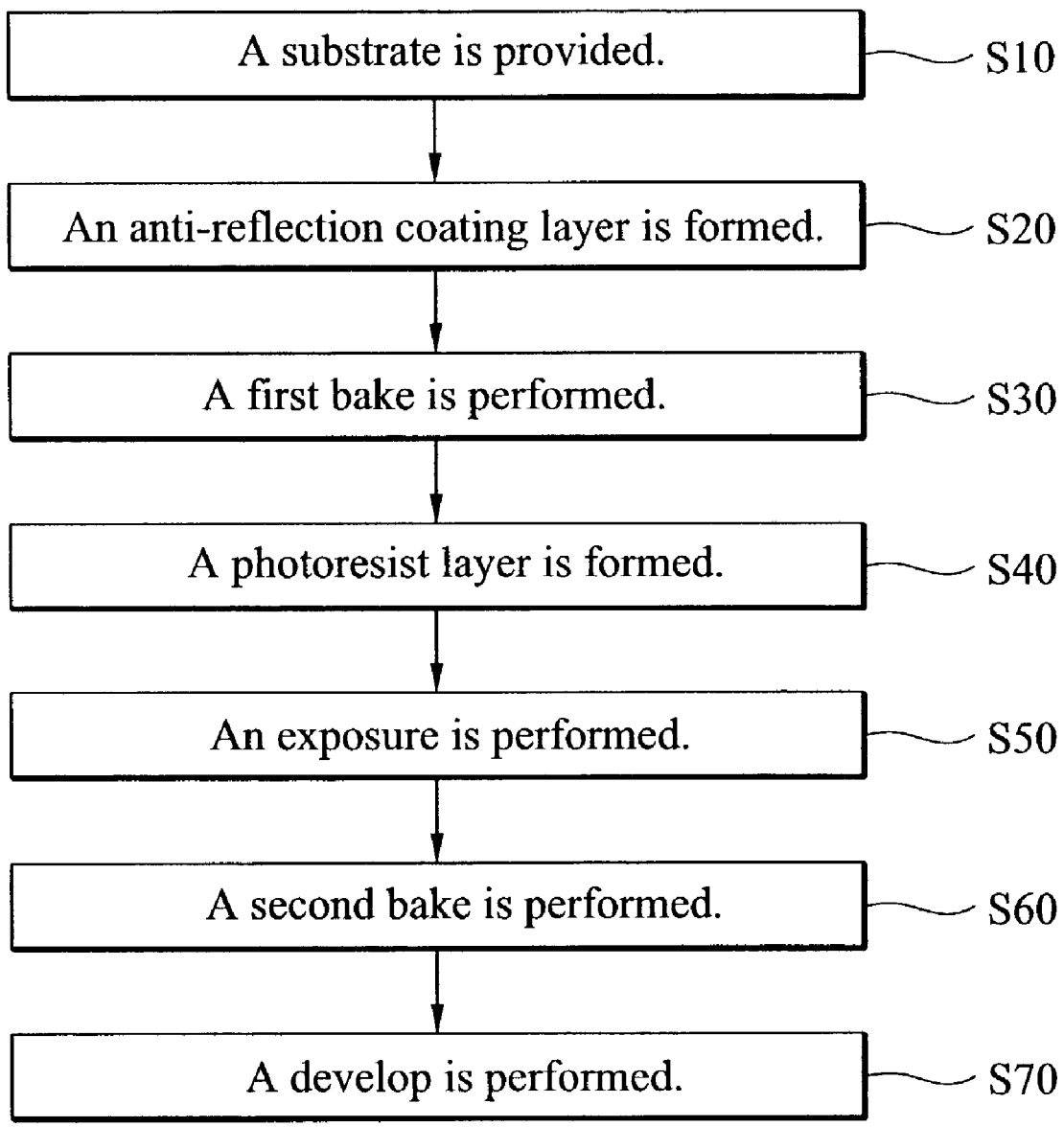
FIG. 3 is a flow chart for forming a patterned photoresist layer according to the preferred embodiment of the invention.

In step S60, development is performed to formed a patterned photoresist layer 140 by as well known technique, as shown in FIG. 2C. The features of the patterned photoresist layer 140 have perfect profiles.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming a patterned photoresist layer, comprising:
   providing a substrate;
   forming an anti-reflection coating layer on the substrate;
   performing a first bake on the anti-reflection coating layer;
   forming a photoresist layer on the anti-reflection coating layer;
   performing an exposure;
   performing a second bake on the photoresist layer, wherein the temperature difference between the first bake and the second bake is about 35° C.~55° C., wherein the second bake is a post-exposure bake; and
   performing development to give a patterned photoresist layer free of undercut and footing,
   wherein the first bake is performed prior to the formation of the photoresist layer.

2. The method as claimed in claim 1, wherein the temperature of the first bake is about 165° C.~205° C.

3. The method as claimed in claim 1, wherein the temperature of the second bake is about 120° C.~140° C.

4. The method as claimed in claim 1, wherein the material of the antireflection coating layer comprises an organic compound.

5. The method as claimed in claim 1, wherein the second bake is performed by an ultraviolet (UV) ray.

6. A method of forming a patterned photoresist layer, comprising:
   providing a substrate;
   forming an anti-reflection coating layer on the substrate;
   performing a first bake on the anti-reflection coating layer;
   forming a photoresist layer on the anti-reflection coating layer;
   performing an exposure;
   performing a second bake on the photoresist layer, wherein the temperature difference between the first bake and the second bake is about 45° C., wherein the second bake is a post-exposure bake; and
   performing development to give a patterned photoresist layer free of undercut and footing,
   wherein the first bake is performed prior to the formation of the photoresist layer.

7. The method as claimed in claim 6, wherein the temperature of the first bake is about 165° C.~205° C.

8. The method as claimed in claim 6, wherein the temperature of the second bake is about 120° C.~140° C.

9. The method as claimed in claim 6, wherein the material of the anti-reflection coating layer comprises an organic compound.

10. The method as claimed in claim 6, wherein the second bake is performed by an ultraviolet (UV) ray.

11. A method of forming a patterned photoresist layer, comprising:
    providing a substrate;
    forming an anti-reflection coating layer on the substrate;
    baking the anti-reflection coating layer on the substrate;
    forming a photoresist layer on the baked anti-reflection coating layer;
    performing an exposure;
    baking the photoresist layer after said exposure, wherein the temperature difference between (i) baking the anti-reflection coating layer and (ii) baking the photoresist layer is about 35° C.~55° C.; and
    performing development to give a patterned photoresist layer free of undercut and footing.

12. The method as claimed in claim 11, wherein the baking the anti-reflection coating layer occurs at a temperature of about 165° C.~205° C.

13. The method as claimed in claim 11, wherein the baking the photoresist layer occurs at a temperature of about 120° C.~140° C.

14. The method as claimed in claim 11, wherein the antireflection coating layer comprises an organic compound.

15. The method as claimed in claim 11, wherein the baking the photoresist layer is performed by an ultraviolet (UV) ray.

* * * * *